United States Patent [19]

Korenaga

[11] Patent Number: 5,681,638
[45] Date of Patent: Oct. 28, 1997

[54] SUBSTRATE, AND METHOD AND APPARATUS FOR HOLDING THE SUBSTRATE

[75] Inventor: Nobushige Korenaga, Utsunomiya, Japan

[73] Assignee: Canon Kabushiki Kaisha, Tokyo, Japan

[21] Appl. No.: 430,803

[22] Filed: Apr. 26, 1995

[30] Foreign Application Priority Data

Apr. 27, 1994 [JP] Japan .................................. 6-111991

[51] Int. Cl.$^6$ .................................................. B32B 7/00
[52] U.S. Cl. ........................ 428/119; 269/55; 269/77; 269/86; 269/97; 269/156; 428/64.1; 428/66.7; 428/120; 428/194; 428/213; 428/215; 428/220
[58] Field of Search ............................... 428/119, 120, 428/220, 194, 64.1, 66.7, 213, 215; 269/55, 77, 86, 97, 156

[56] References Cited

U.S. PATENT DOCUMENTS

5,221,824   6/1993   Saeda .................................. 219/121.82

*Primary Examiner*—Nasser Ahmad
*Attorney, Agent, or Firm*—Fitzpatrick, Cella, Harper & Scinto

[57] ABSTRACT

A substrate includes a flat principal member having a surface, and at least three first holding portions projecting from the principal member. Each of the first holding portions includes a pair of horizontal contact surfaces which are parallel to the surface of the principal member and which are disposed facing opposite to each other. At least three second holding portions are also disposed on the principal member, each of the second holding portions including a pair of vertical contact surfaces which are perpendicular to the surface of the principal member and are disposed facing opposite to each other. Method and apparatus for holding such a substrate includes structure and steps for grasping the at least three first holding portions and the at least three second holding portions. The structure and functions provide a platform for stably gripping a substrate.

15 Claims, 10 Drawing Sheets

SUBSTRATE, AND METHOD AND APPARATUS FOR HOLDING THE SUBSTRATE

BACKGROUND OF THE INVENTION

1. Field of the Invention

This invention relates to a substrate, such as a mask or the like, which can be stably held in a semiconductor exposure apparatus, an EB (electron beam) scanning apparatus, a pattern-size measuring apparatus, or the like without using a magnet, a vacuum chuck or the like, and to a method and apparatus for holding the substrate.

2. Description of the Related Art

Figure 10A:
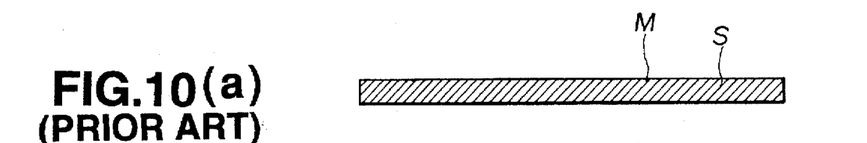
FIGS. 10(a) through 10(f) are diagrams illustrating respective steps of a prior art process for manufacturing a mask.
Figure 10B:
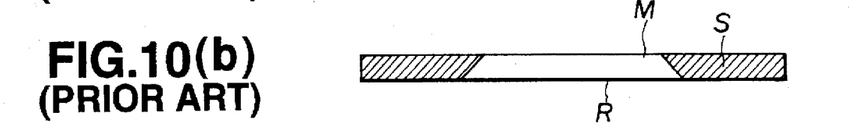
Figure 10C:
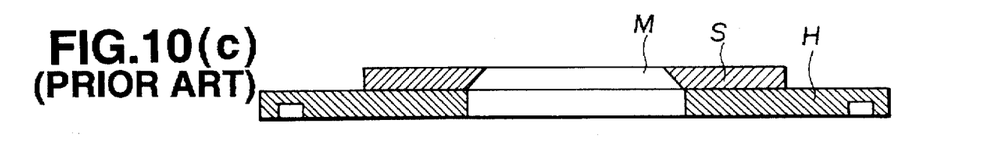
Figure 10D:
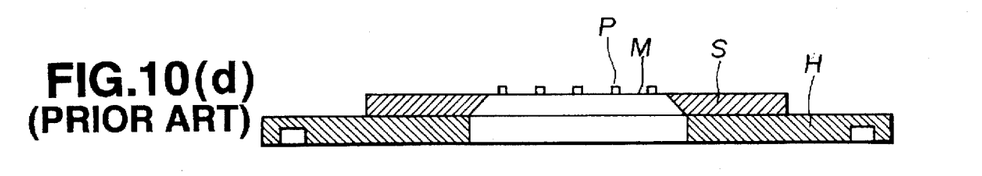
Figure 10E:
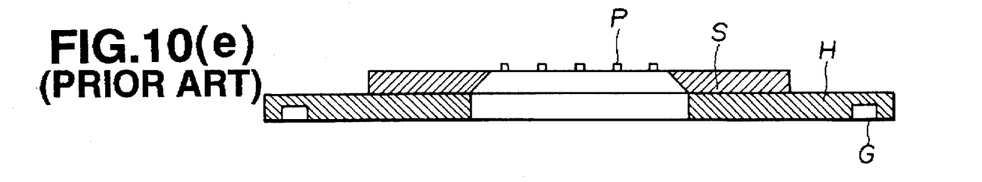
Figure 10F:
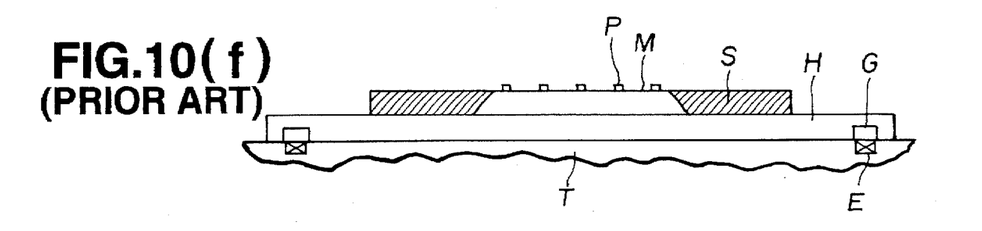

An X-ray mask used in a semiconductor exposure apparatus using X-rays is generally manufactured by processes shown in FIGS. 10(a) through 10(f). That is, as shown in FIG. 10(a), an SiC film M is first deposited in a vacuum on at least one surface of a substrate S made of silicon or the like. Thereafter, as shown in FIG. 10(b), an opening R (covered with the SiC film M) is formed by removing a central portion of the substrate S by back etching. Then, as shown in FIG. 10(c), the base of the substrate S is bonded to a mask frame H. Then, as shown in FIG. 10(d), a pattern P made of a heavy metal is formed on the SiC film M of the opening R by a known EB scanning method, plating or the like, and as shown in FIG. 10(e), a magnetic ring G is fitted in the back of the mask frame H. When fixing a mask formed in the above-described manner on a mask stage T of a semiconductor exposure apparatus, as shown in FIG. 10(f), the magnetic ring G fitted in the base of the mask frame H is attracted onto a permanent magnet or an electromagnet E fitted in the mask stage T.

However, in a process of forming the pattern P on the mask, or in a process of measuring the size of the pattern P after manufacturing the mask, a mask chuck using a permanent magnet or an electromagnet cannot be used because an electron beam is used. Hence, the mask is fixed using a vacuum suction apparatus, spring clamps or the like.

In such cases, distortion generated in the mask by known mechanical fixing is not always the same as distortion generated in the mask by magnetic fixing or the like in a semiconductor exposure apparatus. As a result, the pattern on the mask mounted in the semiconductor exposure apparatus may be deformed from the state when the mask has been manufactured using the EB scanning apparatus, and therefore, there is the possibility that the pattern cannot be transferred and printed onto a wafer with high precision.

SUMMARY OF THE INVENTION

The present invention has been made in consideration of the above-described problems.

It is an object of the present invention to provide a substrate which can be stably held without using a magnet or a vacuum suction apparatus and without unnecessarily constraining a principal portion of the exposure apparatus, an EB scanning apparatus or the like, and a technique of holding the substrate.

According to one aspect, the present invention, which achieves the above-described object, relates to a substrate comprising at least three first holding portions provided outside a principal member thereof, and at least three second holding portions. Each of the first holding portions includes a pair of horizontal contact surfaces which are parallel to the principal member and which are oriented opposite to each other, and each of the second holding portions includes a pair of vertical contact surfaces which are perpendicular to the principal member and which are oriented opposite to each other.

According to another aspect, the present invention relates to a method for holding a substrate comprising the steps of setting a substrate, including a principal member, where at least three first holding portions and at least three second holding portions are provided outside the principal member, on a base plate, grasping each of the first holding portions of the substrate by first grasping means which closes in a direction perpendicular to the base plate, and grasping each of the second holding portions of the substrate by second grasping means which closes in a direction parallel to the base plate.

According to still another aspect, the present invention relates to an apparatus for holding a substrate comprising at least three first grasping means and at least three second grasping means supported on a base plate. Each of the first grasping means comprises a pair of vertical grasping members openable/closable in a direction perpendicular to the base plate, and each of the second grasping means comprises a pair of horizontal grasping members openable/closable in a direction parallel to the base plate.

When mounting a substrate, such as a mask or the like, in an exposure apparatus or an EB scanning apparatus, the entire substrate is positioned in a direction perpendicular to the surface of a base plate (the z-axis direction) by grasping each of at least three first holding portions provided outside a principal member of the substrate by first grasping means, and positioning the substrate within a plane parallel to the surface of the the base plate (the xy plane). Adjustment of the angle of rotation of the substrate around an axis perpendicular to the plane (positioning in the direction of the θ axis) is performed by grasping each of at least three second holding portions by second grasping means. Thus, the substrate is positioned with high precision without unnecessarily constraining the principal member of the substrate, and is stably held in the positioned state.

If each of the first and second grasping means includes a pair of spherical members elastically and rotatably contacting the corresponding holding portion of the substrate, when a flow stress due to thermal expansion or the like has been generated in the positioned substrate, distortion in the principal member of the substrate can be prevented by releasing the flow stress by the rotation of the spherical members. Furthermore, it is possible to prevent the grasping forces generated by the first grasping means and the second grasping means from interfering with each other, so that positioning of the substrate can be smoothly performed with high precision.

The foregoing and other objects, advantages and features of the present invention will become more apparent from the following description of the preferred embodiments taken in conjuction with the accompanying drawings.

BRIEF DESCRIPTION OF THE DRAWINGS

FIGS. 6(a) and 6(b) are diagrams illustrating the configuration of a retainer and a ball.

DESCRIPTION OF THE PREFERRED EMBODIMENTS

A preferred embodiment of the present invention will now be described with reference to the drawings.

Figure 1:
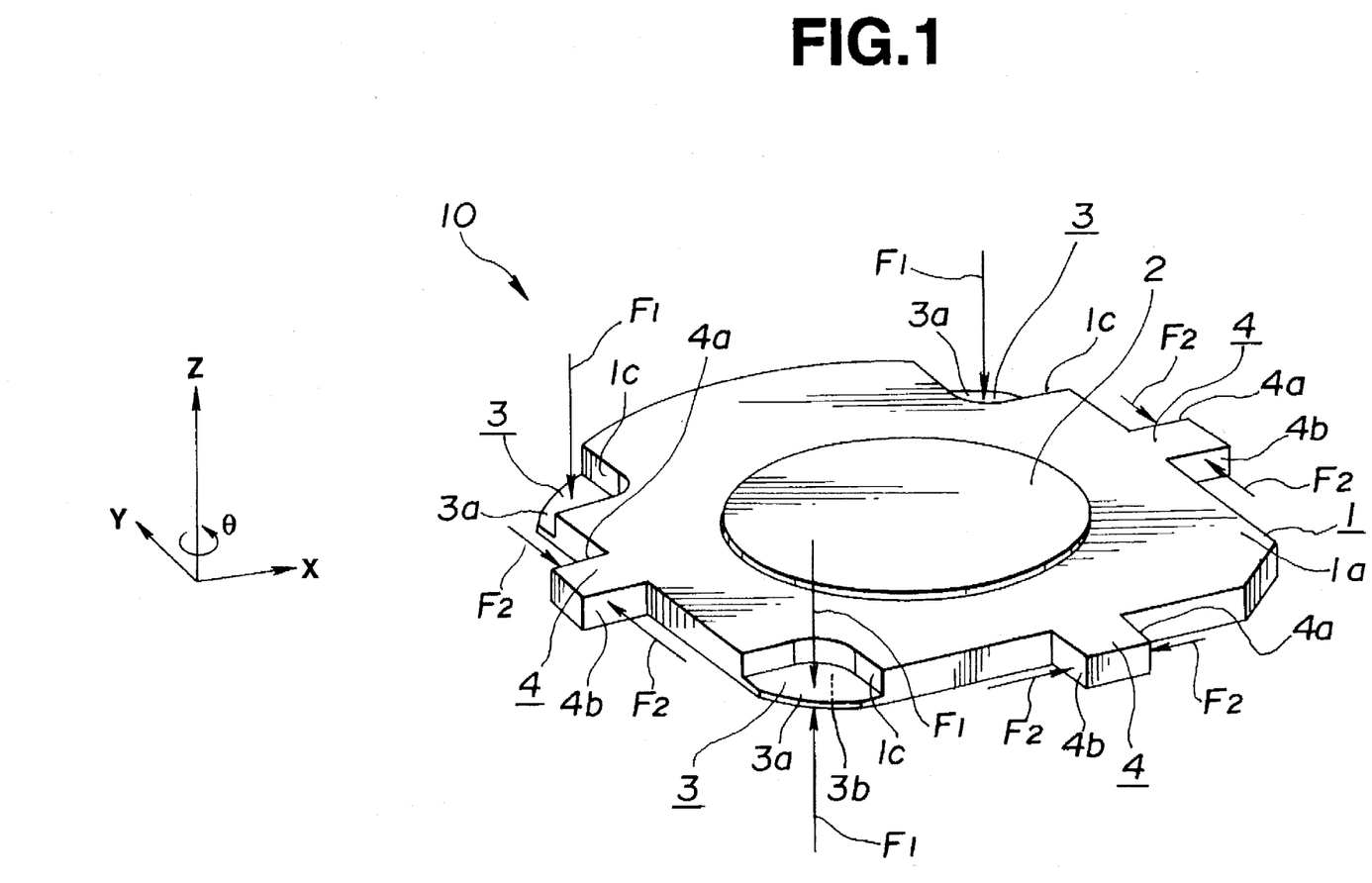
FIG. 1 is a perspective view illustrating a mask according to an embodiment of the present invention.

FIG. 1 illustrates a mask 10, serving as a substrate, according to the embodiment. The mask 10 includes a mask frame 1 including a main body 1a, and a mask substrate 2, serving as a principal member, mounted so as to overlap with an opening (not shown) provided in the main body 1a. The main body 1a of the mask frame 1 includes three Z clamp portions 3, serving as first holding portions, disposed at a predetermined interval in the circumferential direction at the outer circumference of the main body 1a, and three XYθ clamp portions 4, serving as second holding portions, disposed between the three Z clamp portions 3, as shown. Each of the Z clamp portions 3 is a thin portion formed by a notch 1c provided at the outer circumference of the main body 1a of the mask frame 1, and includes a pair of horizontal contact surfaces, comprising a grasping-force operating surface 3a and a reference surface 3b, which are parallel to the surface of the mask substrate 2 and are opposite to each other. Each of the XYθ clamp portions 4 is a protruding portion protruding in the radial direction from the outer circumference of the main body 1a of the mask frame 1, and includes a pair of vertical contact surfaces, comprising a grasping-force operating surface 4a and a reference surface 4b, which are perpendicular to the surface of the mask substrate 2 and are oriented opposite to each other, as shown.

When mounting the mask 10 in an X-ray exposure apparatus, or in an EB scanning apparatus, or in a pattern-size measuring apparatus, positioning of the mask substrate 2 in the z-axis direction is performed by grasping each of the three Z clamp portions 3 using a vertical grasping force $F_1$ operating in the direction of the z axis by means of a substrate holding apparatus 20 (to be described later). Positioning of the entire mask substrate 2 in directions perpendicular to the z axis (the x axis and the y axis), and adjustment of the angle of rotation around the z axis and passing through the center of the mask substrate 2 (in the θ direction) are performed by grasping each of the XYθ clamp portions 4 using a horizontal grasping force $F_2$ operating in the directions of the x and y axes.

Figure 2:
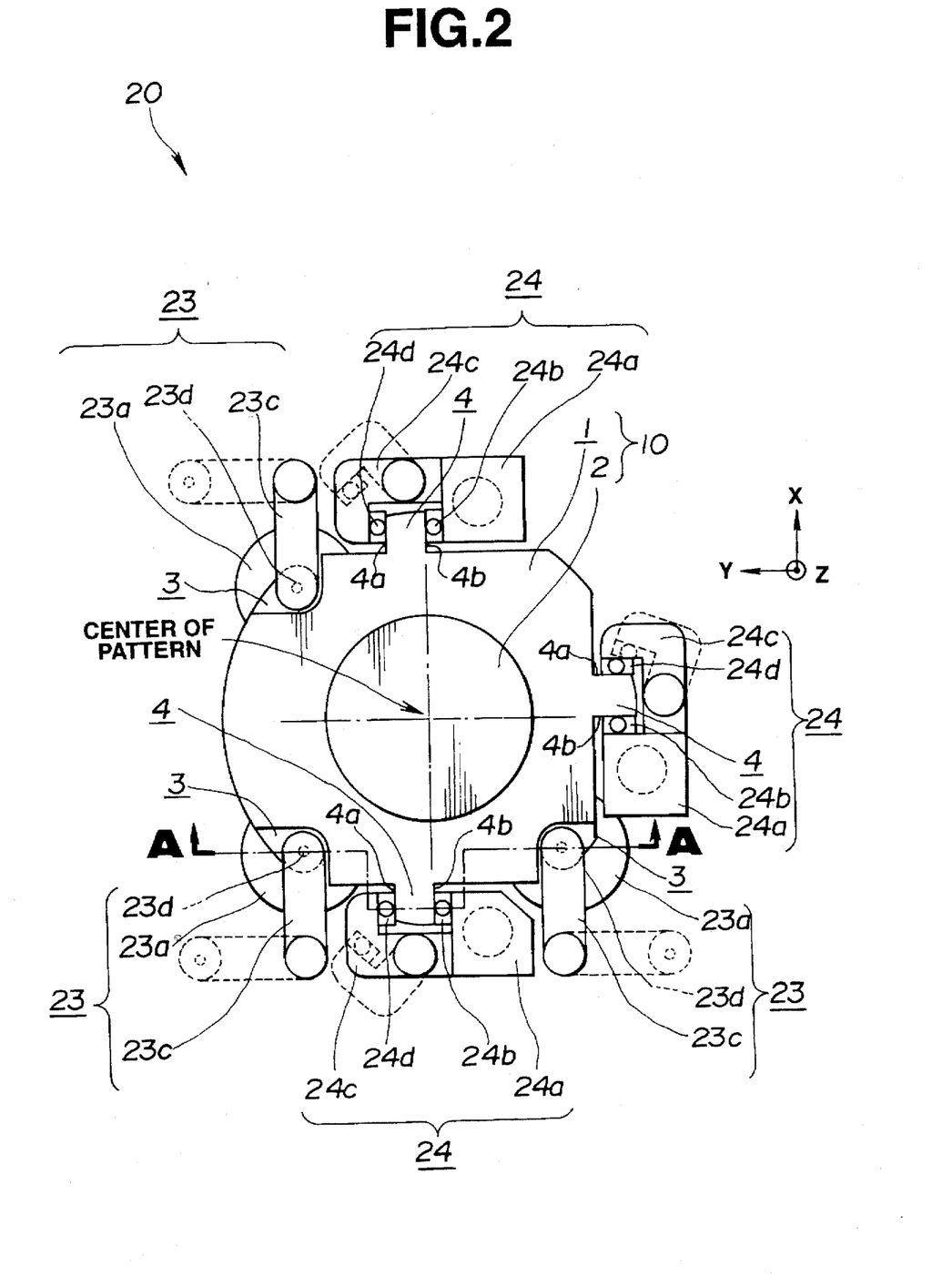
FIG. 2 is a schematic plan view illustrating the mask shown in FIG. 1 and a substrate holding apparatus for holding the mask.
Figure 3:
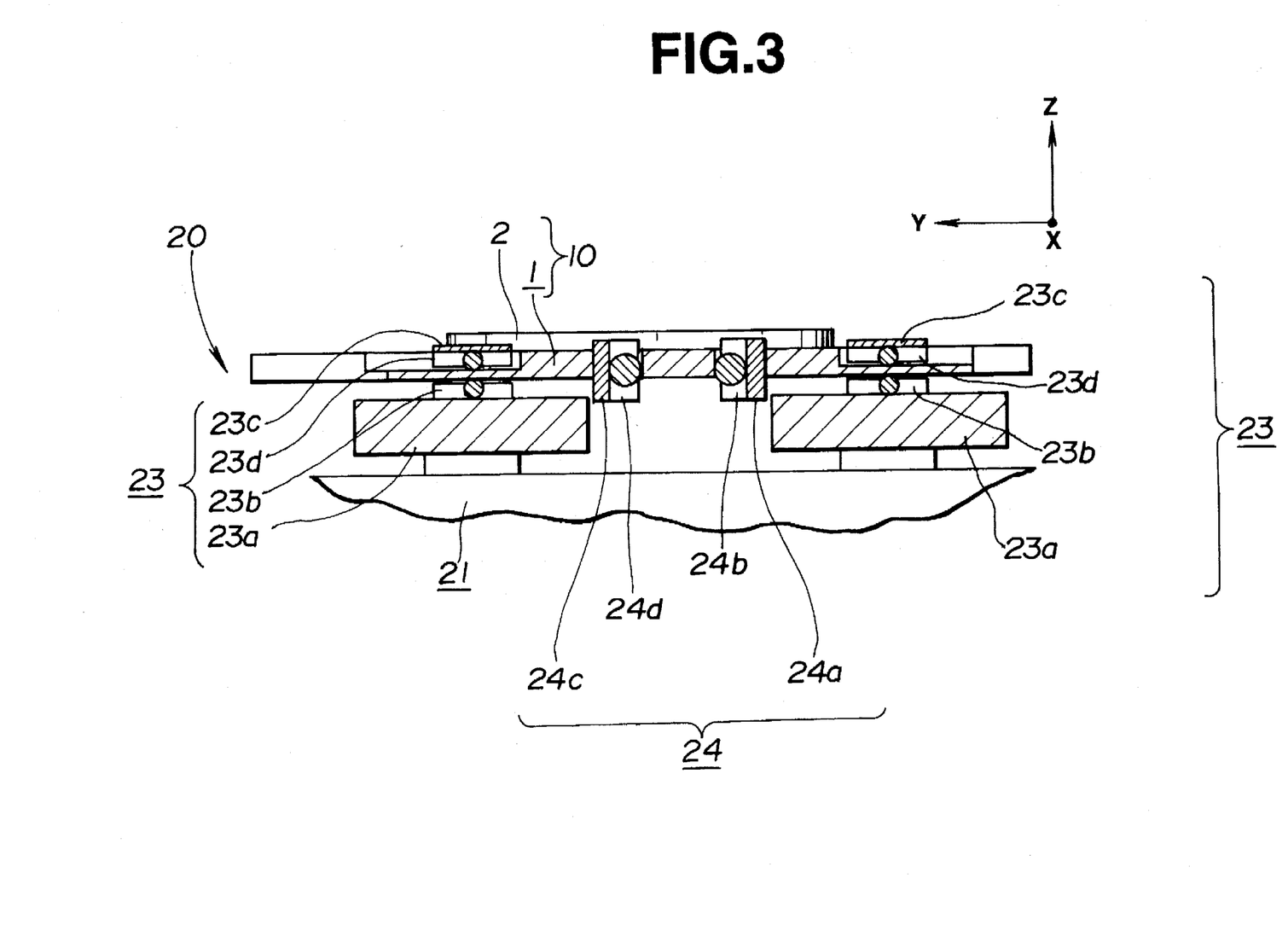
FIG. 3 is a cross-sectional view taken along line A—A shown in FIG. 2.

FIG. 2 is a schematic plan view illustrating the substrate holding apparatus 20 and the mask 10 held therein. FIG. 3 is a cross-sectional view taken along line A—A shown in FIG. 2. The substrate holding apparatus 20 includes three Z clamp units 23, serving as first grasping means, for grasping the corresponding Z clamp portions 3 of the mask 10 using the vertical grasping force $F_1$, and three XYθ clamp units 24, serving as second grasping means, for grasping the corresponding XYθ clamp portions 4 of the mask 10 using the horizontal grasping force $F_2$. The Z clamp units 23 and the XYθ clamp units 24 are supported on a base 21.

Each of the Z clamp units 23 includes a reference block 23a, serving as a first reference member and provided as one body with the base 21, a fixed clamp 23b, serving as a vertical grasping member and fixed to the reference block 23a, a first arm 23c whose one end is pivotably supported on the reference block 23a, a movable clamp 23d, serving as a vertical grasping member and held on the first arm 23c, and a rotation/transfer driving unit 23e (shown in FIG. 4), serving as first opening/closing means, for rotating the arm 23c relative to the reference block 23a and reciprocating the arm 23c in the z-axis direction relative to the reference block 23a. The Z clamp portions 3 of the mask 10 are grasped by mounting them on the corresponding fixed clamps 23b, driving the rotation/transfer driving units 23e, positioning the movable clamps 23d above the corresponding Z clamp portions by pivotably moving the arms 23c, and closing the movable clamps 23d above the corresponding fixed clamps 23b by moving the arms 23c in the z-axis direction.

Each of the XYθ clamp units 24 includes a reference block 24a, serving as a second reference member and provided as one body with the base 21, a fixed clamp 24b, serving as a horizontal grasping member and fixed to the reference block 24a, a second arm 24c whose one end is pivotably mounted on the reference block 24a, a movable clamp 24d, serving as a horizontal grasping member and held on the second arm 24c, and a rotation driving member 24e (shown in FIG. 5), serving as second opening/closing means, for rotating the arm 24c relative to the reference block 24a. The XYθ clamp portions 4 are grasped by contacting the fixed clamps 24b to the corresponding XYθ clamp portions 4 of the mask 10, driving the rotation driving members 24e, and closing the fixed clamps 24b and the movable clamps 24d parallel to the surface of the base 21 by rotating the arms 24c.

In FIG. 2, the three reference surfaces 4b provided at the main body 1a are designed so that the center of the mask substrate 2 is intersected by a line extending from each of the reference surfaces 4b, as shown. That is, the center of the mask substrate cn be positioned at a reference position using the three reference surfaces 4b and the three reference blocks 24a.

Figure 5:
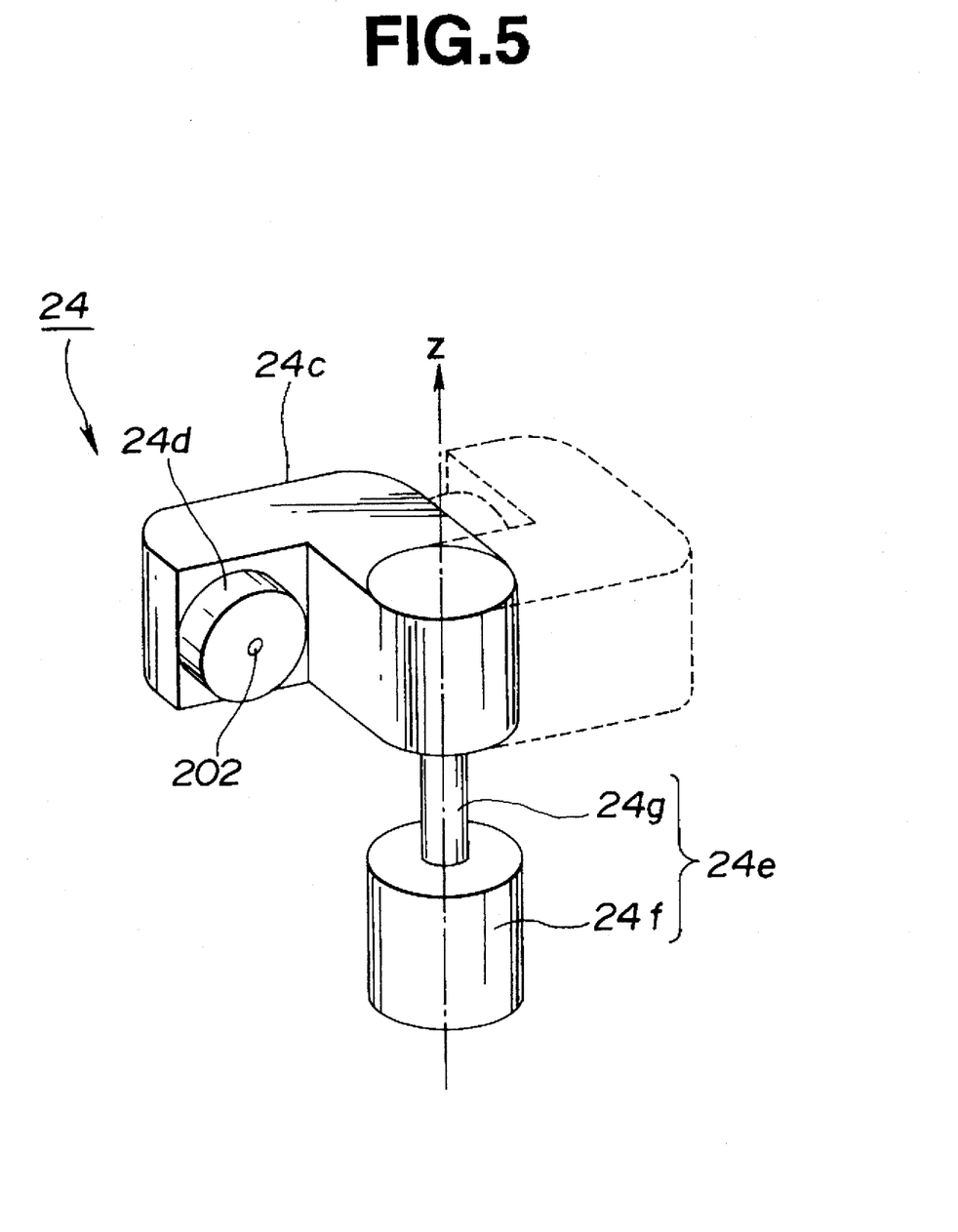
FIG. 5 is a diagram illustrating a rotation driving unit of the apparatus shown in FIG. 2.

As shown in FIG. 5, the rotation driving unit 24e of each of the XYθ clamp units 24 includes a rotation rod 24g integral with the arm 24c, and a rotating pneumatic cylinder 24f for rotating the rotation rod 24g around the z axis. By driving the rotating pneumatic cylinder 24f, the rotation rod 24g is rotated by a predetermined angle to pivotally move the arm 24c from the position indicated by solid lines to the position indicated by broken lines, or vice versa.

Figure 4:
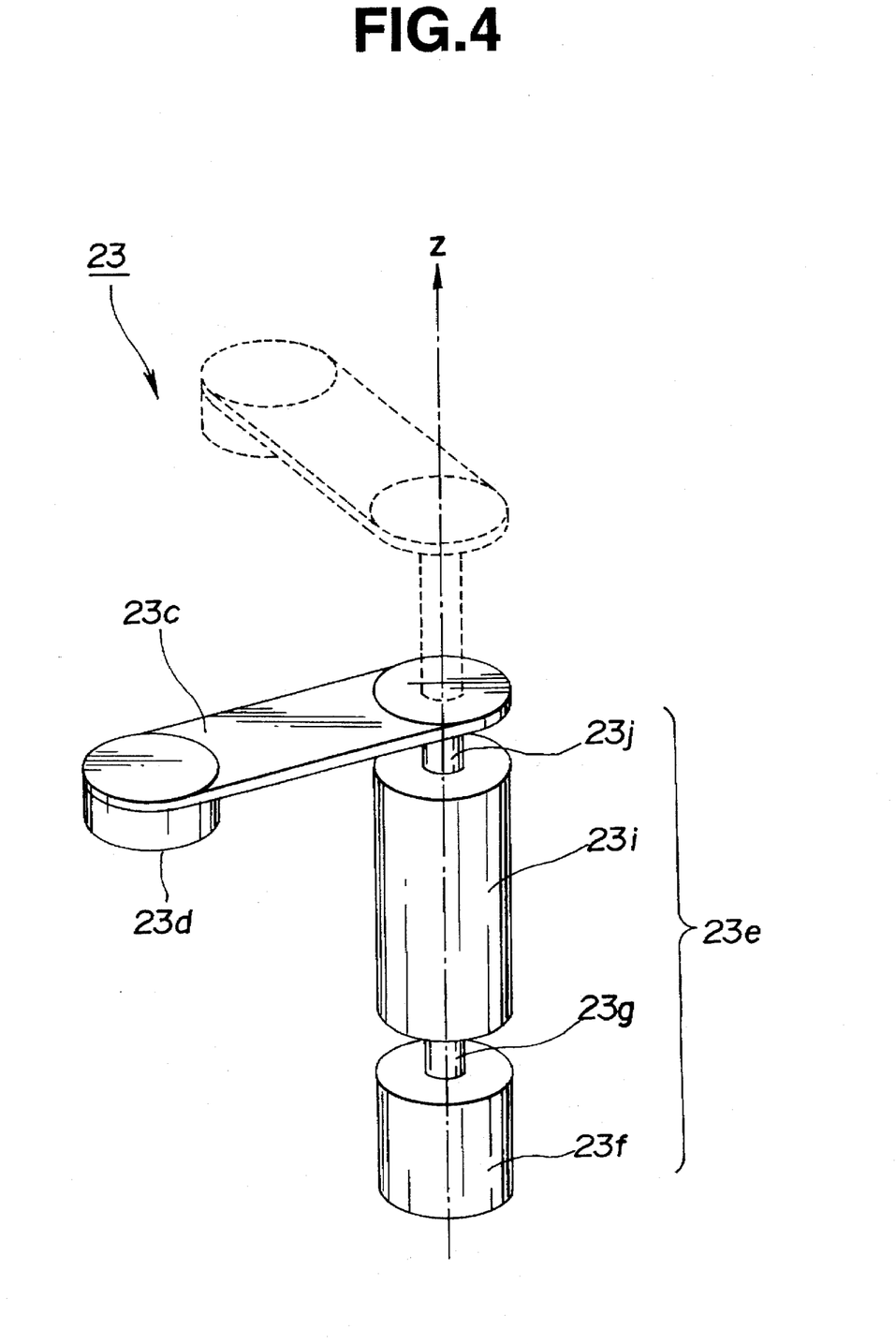
FIG. 4 is a diagram illustrating a rotation/translation driving unit of the apparatus shown in FIG. 2.

As shown in FIG. 4, the rotation/transfer driving member 23e of each of the Z clamp units 23 includes a transfer rod 23j integral with the arm 23c, a translation pneumatic cylinder 23i for vertically moving the translation rod 23j by a predetermined distance, a rotation rod 23g integral with the translation pneumatic cylinder 23i, and a rotating pneumatic cylinder 23f for rotating the rotation rod 23g around the z axis by a predetermined angle. When closing the Z clamp unit 23, the translation rod 23j is first raised to a state indicated by broken lines by driving the translation pneumatic cylinder 23i, and the rotation rod 23g is then rotated by driving the rotating pneumatic cylinder 23f. Electric motors may, of course, be used instead of the rotating pneumatic cylinders 23f and 24f.

Figure 6A:
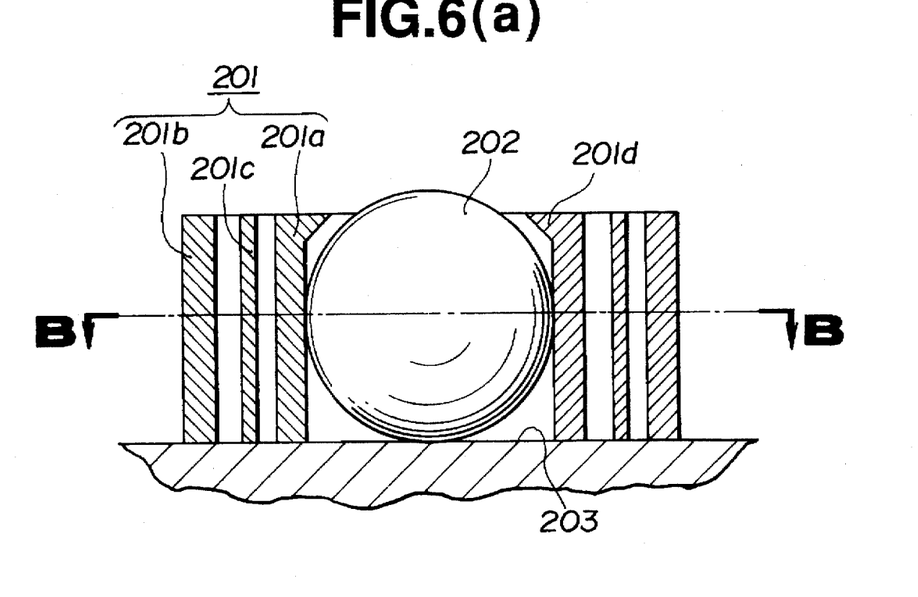
FIG. 6(a) is a cross-sectional view in the axial direction.
Figure 6B:
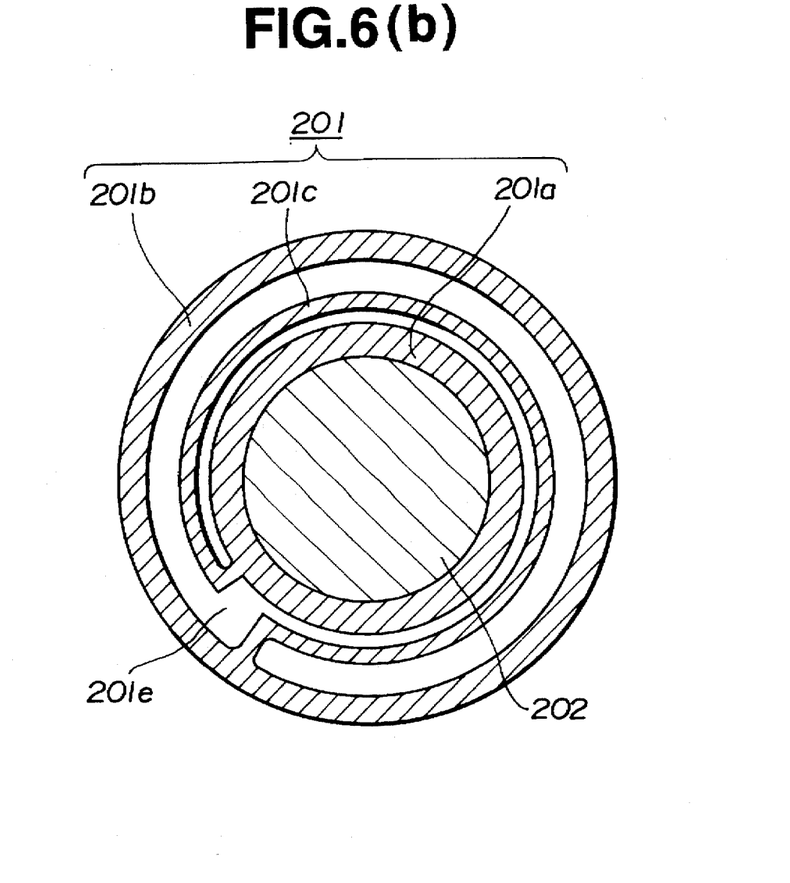
FIG. 6(b) is a cross-sectional view as seen from line B—B shown in FIG. 6(a)

As shown in FIG. 6, each of the fixed clamp 23b and the movable clamp 23d of the Z clamp unit 23, and each of the fixed clamp 24b and the movable clamp 24d of the XYθ clamp unit 24 comprises a retainer 201, serving as a cylindrical supporting member, and a ball 202, serving as a spherical member, to be in contact with the Z clamp portion 3 or the XYθ clamp portion 4 of the mask 10 while being held by the retainer 201. The retainer 201 includes an inner cylinder 201a for rotatably holding the ball 202, an outer cylinder 201b coaxially disposed outside the inner cylinder 201a, and a cylindrical spring 201c disposed between the inner cylinder 201a and the outer cylinder 201b. The outer cylinder 201b is connected to the reference block 23a or 24a, or to a reference surface 203 provided on the arm 23c or 24c of the Z clamp unit 23 or the XYθ clamp unit 24, respectively, as one body therewith. The inner cylinder 201a and the cylindrical spring 201c are slidable on the reference surface 203. A projection 201d protruding from the inner cylinder 201a in the radial direction is provided at a free end opposite to the end surface sliding on the reference surface 203, in order to prevent the ball 202 from leaving the inner cylinder 201a.

The cylindrical spring 201c includes a slit portion 201e extending in the axial direction. The cylindrical spring 201c is connected to the inner cylinder 201a at one end of the slit portion 201e as one body therewith, and to the outer cylinder 201b at the other end of the slit portion 201e as one body therewith, so that the inner cylinder 201a and the cylindrical spring 201c can elastically move on the reference surface 203 in an arbitrary direction by a small amount together with the rotation of the ball 202. That is, when the Z clamp units 23 and the XYθ clamp units 24 grasp the corresponding Z clamp portions 3 and XYθ clamp portions of the mask 10, respectively, each of the balls 202 contacting the horizontal contact surfaces 3a or 3b, or the vertical contact surfaces 4a and 4b is rotatable in an arbitrary direction on the reference surface 203 within the inner cylinder 201a. Also, each of the Z clamp portions 3 and the XYθ clamp portions 4 can be elastically displaced in an arbitrary direction within a plane perpendicular to the corresponding grasping force $F_1$, $F_2$ by a small amount by the rotation of the ball 202. Accordingly, positioning of the mask 10 can be very precisely and smoothly performed and the positioned mask 10 can be stably held while preventing the vertical grasping force $F_1$ and the horizontal grasping force $F_2$ from interfering with each other. Furthermore, even if the mask 10 is subjected to thermal expansion caused by exposure light or the like, and a stress, such as a bending moment, a tensile force, a compressive force or the like, is thereby generated, each of the Z clamp units 23 and the XYθ clamp units 24 absorbs thermal distortion in a direction perpendicular to the corresponding grasping force, so that the mask substrate 2 is not greatly deformed so as to cause a deviation in the transfer of the pattern. That is, it is possible to very stably hold the mask 10 during exposure, EB scanning, or the measurement of the pattern size, and to prevent the mask 10 from being greatly deformed by thermal distortion or the like.

Furthermore, as described above, since the main body 1a is designed so that projections of the three reference surfaces 4b intersect the center of the mask substrate 2, the center can be maintained at the reference position even if the mask substrate 2 expands by heat. Accordingly, when correcting expansion of the entire mask substrate using an optical system with magnification, very little lateral deviation is generated, and therefore, alignment accuracy is not reduced.

Figure 7:
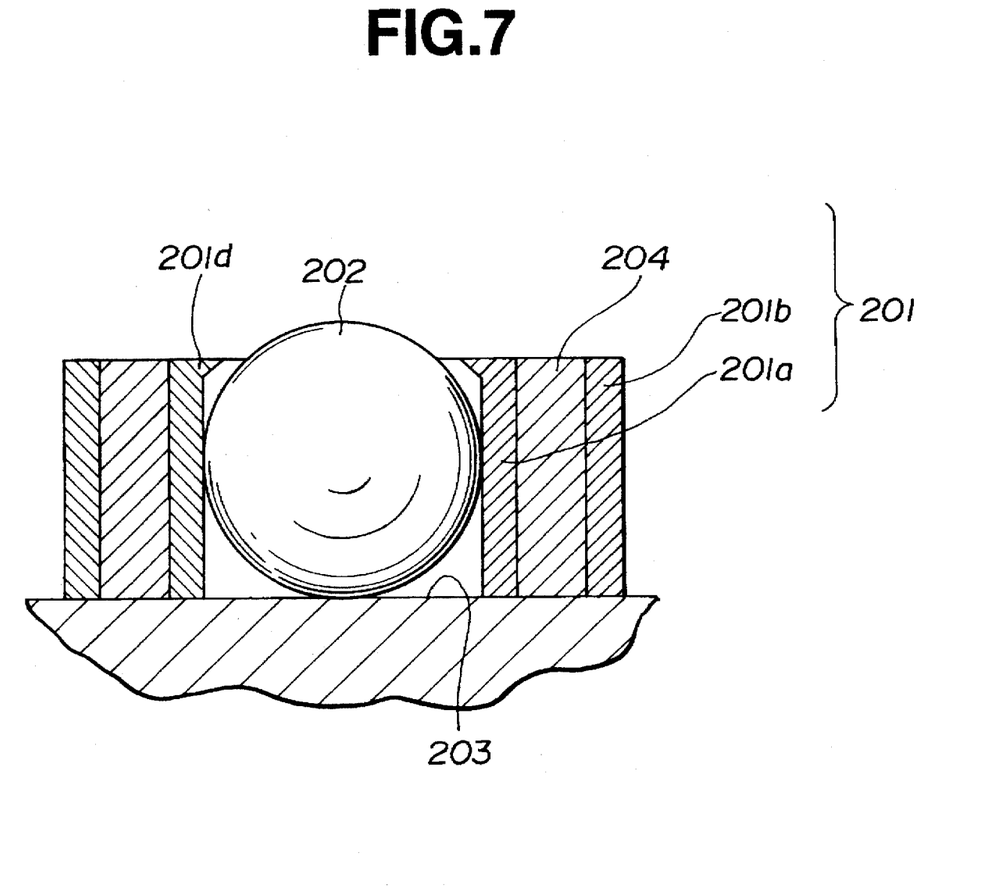
FIG. 7 is a cross-sectional view illustrating a modification of the retainer shown in FIGS. 6(a) and 6(b)

As shown in FIG. 7, a silicone rubber material 204 may fill the space between the inner cylinder 201a and the outer cylinder 201b instead of the cylindrical spring 201c of the retainer 201.

At least three Z clamp portions 3 and at least three XYθ clamp portions 4 are preferred. An increase in the number of these portions provides various advantages, for example, an increase in stability when the mask 10 is held in the substrate holding apparatus 20, but also causes an increase in cost.

The mask 10 is positioned in the substrate holding apparatus 20 according to the following procedures. First, the respective arms 23c of the Z clamp units 23 and the respective arms 24c of the XYθ clamp units 24 are rotated to positions indicated by broken lines in FIG. 2, and the mask 10 is conveyed into the substrate holding apparatus 20 using a conveying device, e.g., a hand or the like (not shown). After contacting the Z clamp units 3 to the fixed clamps 23b of the corresponding Z clamp units 23, the attracting force of the conveying device is released, so that the mask 10 is supported on the Z clamp units 23. At that time, the fixed clamp 24b of each of the XYθ clamp units 24 faces one of the vertical contact surfaces 4a and 4b of the corresponding XYθ clamp portion 4 of the mask 10 in the vicinity thereof. Then, the respective arms 23c of the Z clamp units 23 are rotated to positions indicated by solid lines and moved in the z-axis direction, and the movable clamps 23d are closed toward the corresponding fixed clamps 23b to grasp the Z clamp portions 3 of the mask 10 therebetween, and the entire mask 10 is positioned in the z-axis direction. Thereafter, the respective arms 24c of the XYθ clamp units 24 are rotated to positions indicated by solid lines, and the movable clamps 24d are closed toward the corresponding fixed clamps 24d to grasp the XYθ clamp portions 4 of the mask 10 therebetween, and the mask 10 is positioned within the xy plane and in the θ direction. Alternatively, the mask 10 may be positioned in the substrate holding apparatus 20 using procedures reverse to the above-described positioning procedures. Also, the z-axis, θ direction, and xy plane positioning may be performed independently.

According to the present embodiment, in an X-ray exposure apparatus or the like, a substrate, such as a mask 10 or the like, can be very precisely positioned and very stably held. Furthermore, the present embodiment can also be applied to an EB scanning apparatus which cannot use a magnet. Accordingly, if the same configuration is adopted for substrate holding apparatuses of an X-ray exposure apparatus, an EB scanning apparatus, and a pattern-size measuring apparatus, distortion generated in the substrate due to a grasping force of each of the substrate holding apparatuses is the same. Hence, distortion in the pattern caused by transferring the substrate between the respective substrate holding apparatuses can be prevented.

Figure 8:
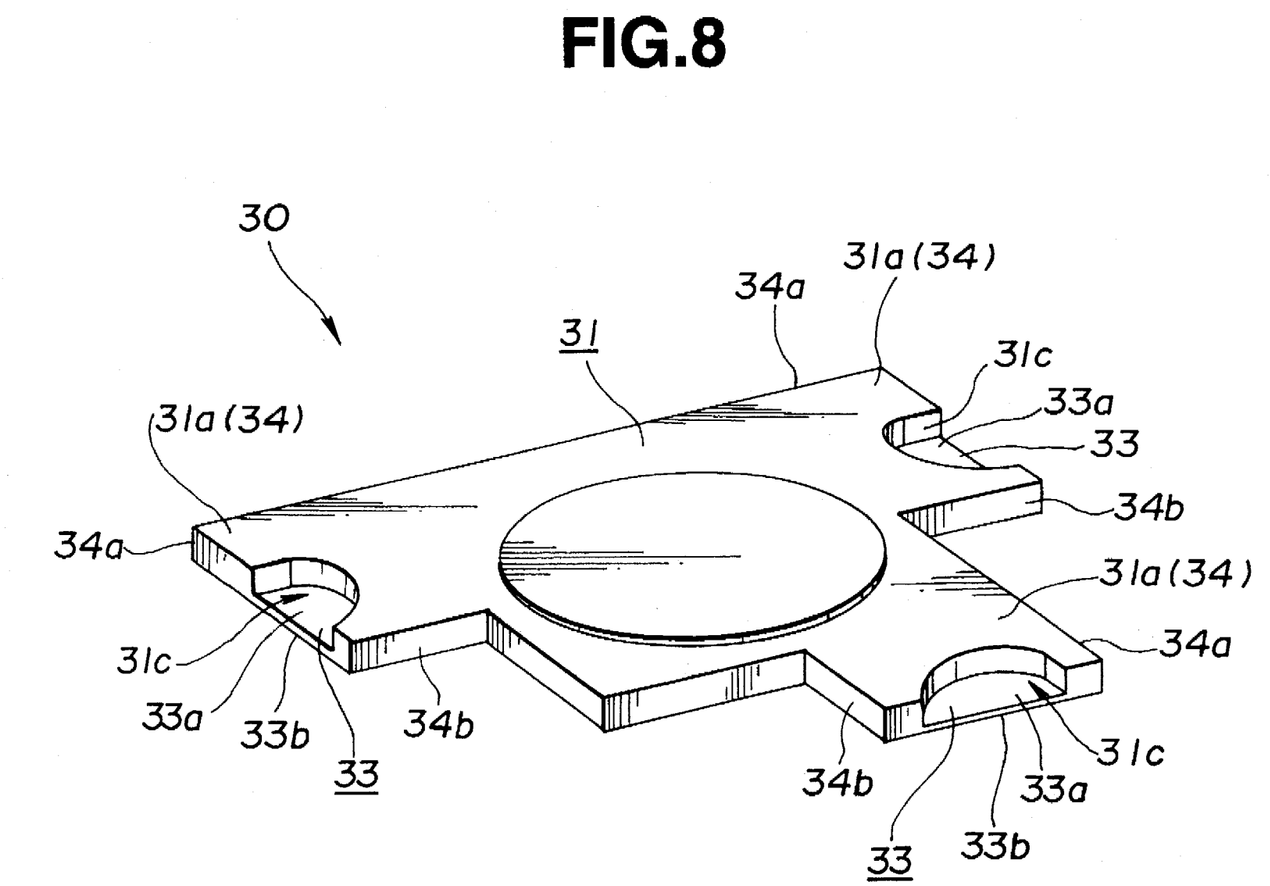
FIG. 8 is a perspective view illustrating a mask according to another embodiment of the present invention.

FIG. 8 illustrates a mask 30 according to another embodiment of the present invention. In this embodiment, three protruding members 31a are integrally provided at predetermined intervals on the circumference of a mask frame 31 which has a similar configuration as the mask frame 1 in the previously-described embodiment. A notch 31c is provided in each of the protruding members 31a, and a Z clamp portion 33 comprising a thin portion having horizontal contact surfaces 33a and 33b is provided in the notch 31c. A vertical contact surface 34a and a reference surface 34b are provided at two sides of each of the protruding members 31a, so that the entire protruding member 31a provides an XYθ clamp portion 34. As in the case shown in FIGS. 1 and 2, the three reference surfaces are designed so that lines projecting therefrom will intersect the center of the pattern.

Figure 9:
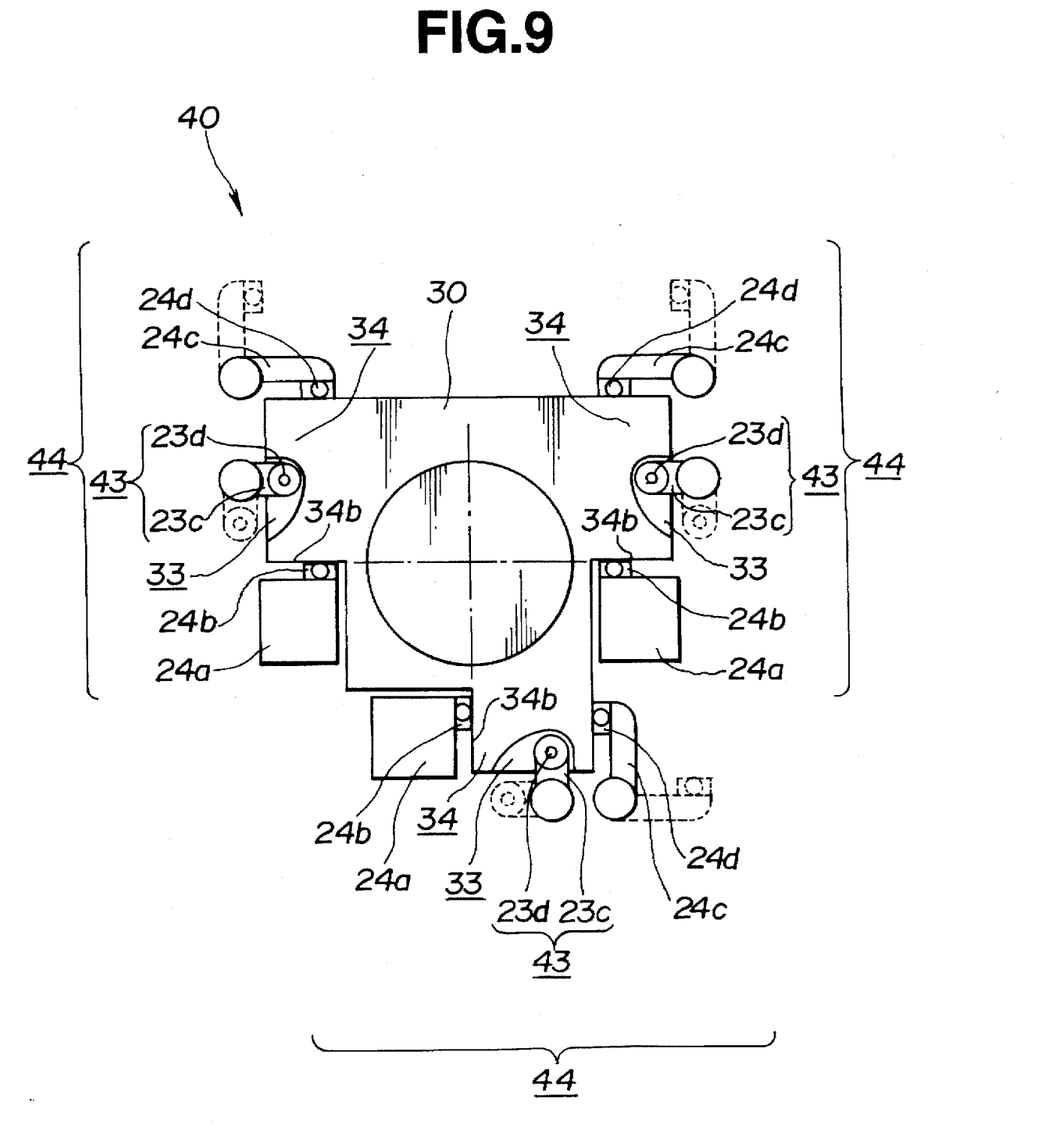
FIG. 9 is a schematic plan view illustrating the mask shown in FIG. 8 and a substrate holding apparatus for holding the mask.

As shown in FIG. 9, a substrate holding apparatus for holding the mask 30 comprises three Z clamp units 43 for grasping the corresponding Z clamp portions 33, and three XYθ clamp units 44 for grasping two sides of the corresponding protruding members 31a. The Z clamp unit 43 and the XYθ clamp unit 44 have a similar configuration to those of the Z clamp unit 23 and the XYθ clamp unit 24 shown in FIGS. 2 and 3. In the present embodiment, the mask 30 can be easily processed since the outer circumference of the mask has a smaller curved portion.

Although in the embodiments described above, the substrate is a mask, the present embodiment may, of course, be applied, for example, to a wafer to which a pattern on a mask is transferred.

The individual components shown in outline in the drawings are all well known in the substrate arts and in the substrate holding method and apparatus arts, and their specific construction and operation are not critical to the operation or the best mode for carrying out the invention.

While the present invention has been described with respect to what is presently considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A substrate comprising:
    a principal member having a major surface;
    at least three first holding portions disposed on said principal member, each of said first holding portions being recessed from the major surface of said principal member and including a pair of horizontal contact surfaces which are parallel to said surface of said principal member and which are disposed facing opposite to each other; and
    at least three second holding portions projecting from said principal member, each of said second holding portions including a pair of vertical contact surfaces which are perpendicular to the major surface of said principal member and which are disposed facing opposite to each other.

2. A substrate according to claim 1, wherein said substrate comprises a mask on which a pattern is formed.

3. A substrate according to claim 1, wherein each of said first holding portions comprises a recessed portion provided at an outer circumference of said substrate, and wherein each of said second holding portions comprises a protruding portion protruding from the outer circumference of said substrate.

4. A substrate according to claim 1, wherein each of said second holding portions comprises a protruding portion protruding from an outer circumference of said substrate, and wherein each of said first holding portions comprises a recessed portion provided within a corresponding protruding portion.

5. A substrate according to claim 1, wherein each of said first and second holding portions includes a holding-force operating surface and a reference surface, and wherein each of at least three of the six reference surfaces is positioned so that a line extending therefrom intersects the center of a pattern disposed on the principal member surface.

6. A method for holding a mask having a principal member having a major surface with at least three first holding portions disposed on the principal member, each of the first holding portions being recessed from the major surface of the principal member and including a pair of horizontal contact surfaces which are parallel to said surface of the principal member and which are disposed facing opposite to each other and at least three second holding portions projecting from the principal member, each of the second holding portions including a pair of vertical contact surfaces which are perpendicular to the major surface of the principal member and which are disposed facing opposite to each other, said method comprising the steps of:
    setting the mask on a base plate surface of a holding apparatus;
    grasping each of the first holding portions of the mask using a first grasping means closing in a direction perpendicular to the base plate surface; and
    grasping each of the second holding portions of the substrate using a second grasping means closing in a direction parallel to the base plate surface.

7. A method according to claim 6, wherein the mask comprises an X-ray mask for X-ray exposure.

8. A method according to claim 7, further comprising the step of providing energy to the mask held on the base plate.

9. A method according to claim 7, wherein said step of setting the substrate includes the step of setting one of a mask having a pattern formed thereon and a mask on which the pattern has not yet been formed.

10. A method according to claim 6, wherein each of said grasping steps includes the step of grasping the corresponding holding portion using a pair of spherical members elastically and rotatably contacting said corresponding holding portion.

11. An apparatus for holding a mask, the mask having a principal member having a major surface with at least three first holding portions disposed on the principal member, each of the first holding portions being recessed from the major surface of the principal member and including a pair of horizontal contact surfaces which are parallel to said surface of the principal member and which are disposed facing opposite to each other and at least three second holding portions projecting from the principal member, each of the second holding portions including a pair of vertical contact surfaces which are perpendicular to the major surface of the principal member and which are disposed facing opposite to each other, said apparatus comprising:
    at least three first grasping means and at least three second grasping means supported on a base plate having a horizontal surface, each of said first grasping means comprising a pair of vertical grasping members operable/closable in a direction perpendicular to the base plate surface, and each of said second grasping means comprising a pair of horizontal grasping members openable/closable in a direction parallel to the base plate surface.

12. An apparatus according to claim 11, wherein each of said vertical grasping members and said horizontal grasping members comprises (i) a supporting member having a surface, and (ii) a spherical member supported by said supporting member so as to be elastically movable in a direction parallel to said supporting member surface.

13. An apparatus according to claim 12, wherein said supporting member includes (i) a cylindrical support which supports said spherical member, and (ii) a cylindrical spring disposed between said cylindrical support and said spherical member.

14. An apparatus according to claim 12, wherein said supporting member includes (i) a cylindrical support which supports said spherical member, and (ii) a silicone rubber disposed between said cylindrical support and said spherical member.

15. An apparatus according to claim 11, wherein one of said pair of vertical grasping members is supported on a first reference member integral with the base plate, and the other is supported on a first arm reciprocatable in a direction perpendicular to the surface of the base plate and rotatable around an axis perpendicular to the surface of the base plate, and wherein one of said pair of horizontal grasping members is supported on a second reference member integral with the base plate, and the other is supported on a second arm rotatable around an axis perpendicular to the surface of the base plate.

\* \* \* \* \*